United States Patent
Schuhmacher et al.

(10) Patent No.: US 6,187,158 B1
(45) Date of Patent: Feb. 13, 2001

(54) DEVICE FOR COATING PLATE-SHAPED SUBSTRATES

(75) Inventors: Manfred Schuhmacher, Alzenau-Michelbach; Andreas Sauer, Hösbach; Katja Grundmann, Hainburg, all of (DE)

(73) Assignee: Leybold Systems GmbH, Hanau (DE)

(*) Notice: Under 35 U.S.C. 154(b), the term of this patent shall be extended for 0 days.

(21) Appl. No.: 09/362,498

(22) Filed: Jul. 30, 1999

(30) Foreign Application Priority Data

Jul. 31, 1998 (DE) .............................................. 198 34 592

(51) Int. Cl.⁷ .................................................... C23C 14/34
(52) U.S. Cl. ................................ 204/298.12; 204/298.11; 204/298.09; 204/298.07; 204/298.25; 204/298.23
(58) Field of Search .......................... 204/298.12, 298.11, 204/298.09, 298.07, 298.25, 298.23

(56) References Cited

U.S. PATENT DOCUMENTS

| | | | |
|---|---|---|---|
| 5,223,111 | * 6/1993 | Lueft ................................ | 204/298.11 |
| 5,328,585 | * 7/1994 | Stevenson et al. ............. | 204/298.09 |
| 5,382,126 | * 1/1995 | Hartig et al. ..................... | 204/298.25 |
| 5,738,770 | 4/1998 | Stauss et al. ..................... | 204/298.12 |

FOREIGN PATENT DOCUMENTS

| | | | |
|---|---|---|---|
| 42 25 531 A1 | 2/1994 | (DE) | ............................... C23C/14/34 |
| 195 40 053 A1 | 4/1997 | (DE) | ............................... H01J/37/34 |
| 196 46 700 A1 | 5/1997 | (DE) | ............................... C23C/14/34 |
| 197 33 940 A1 | 2/1999 | (DE) | ............................... C23C/14/34 |
| 0625792 | 11/1994 | (EP) | ............................... H01J/37/34 |
| 0654543 | 5/1995 | (EP) | ............................... C23C/14/34 |
| WO 00/08671 | 2/2000 | (EP) | ............................... H01J/37/34 |
| 98/02597 | 1/1998 | (WO) | ............................... C23C/14/34 |

* cited by examiner

*Primary Examiner*—Nam Nguyen
*Assistant Examiner*—Daborah Chacko-Davis
(74) *Attorney, Agent, or Firm*—Smith, Gambrell & Russell, LLP

(57) ABSTRACT

A device for coating plate-shaped substrates by using cathode sputtering has several process chambers one after the other, each of which are bordered on the top by a chamber roof having in each case an opening. In this opening, which is covered at the top by a cathode arrangement, a frame is inserted. Screens and coolant lines of the process chamber are provided on the frame that can slide upwards out of the opening, projects into the process chamber, and is supported inside the opening of the chamber roof. A top of the cathode arrangement projects over the frame on the sides and is supported directly on the chamber roof so it seals it.

11 Claims, 3 Drawing Sheets

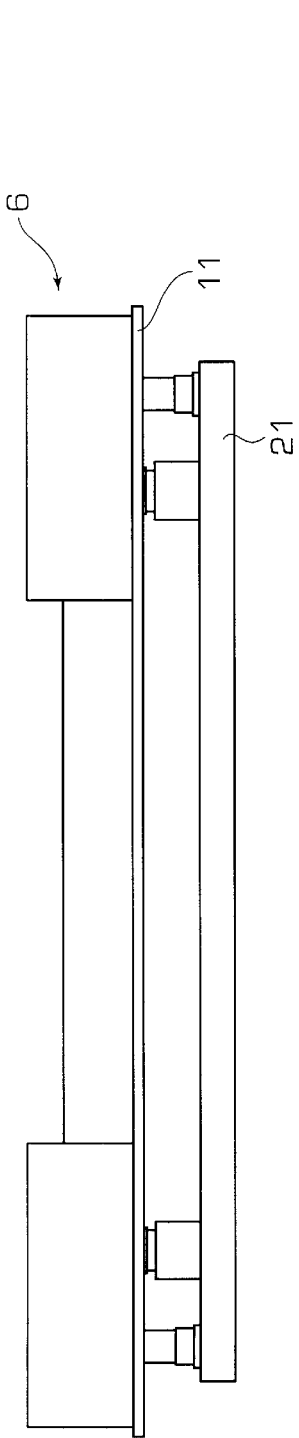
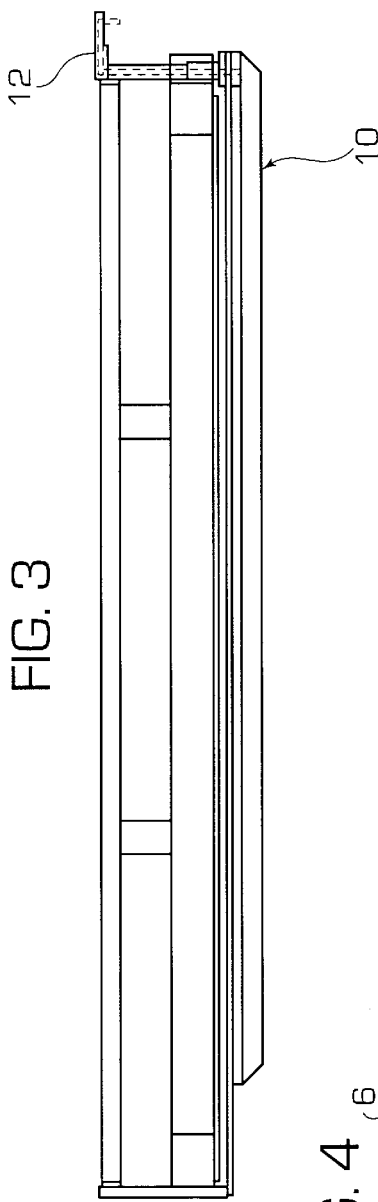
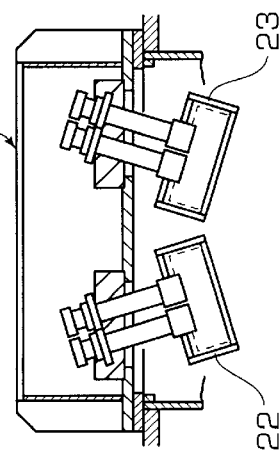

DEVICE FOR COATING PLATE-SHAPED SUBSTRATES

BACKGROUND OF THE INVENTION

The invention concerns a device for coating plate-shaped substrates by using cathode sputtering, which has several process chambers one after the other, each of which is bordered on the top by a chamber roof, which in each case has an opening that is covered by a top with at least one cathode and that has screens and supply lines, especially coolant lines, in the process chamber.

Devices of the foregoing type are frequently used and are generally known in the technology for coating plate-shaped substrates. The cathodes and other things built into them, especially the screens and coolant lines, are firmly installed in the process chamber. This has the disadvantage that dismantling the parts of the apparatus is expensive and leads to undesirably long periods of down time if parts must be disassembled and then reassembled for cleaning purposes.

SUMMARY OF THE INVENTION

The invention seeks to solve the problem of creating a device of the type mentioned at the outset for coating plate-shaped substrates in such a way that their cathodes and the things built into the chamber can be as quickly disassembled and reassembled as possible.

This problem is solved according to the invention by providing the screens and supply lines, especially the coolant lines, on a frame that slides out of the opening upwards and projects into the process chamber and that is supported by support parts on supporting surfaces of the chamber roof and by the fact that the top projects over the supporting parts and sits directly on top of the chamber roof in a way that seals it.

Through this design it is possible to take out all the parts of the coating station from the top of the process chamber and to quickly interchange a second frame and a second cathode arrangement or to clean the disassembled parts and reassemble them by sliding in the frame and the cover with the cathodes. Use of the invention results in especially small down times of the coating device. Because the top projects over the supporting parts and sits directly on the chamber roof, only the top must be sealed opposite the chamber roof.

The top having the cathodes can be designed so it is completely flat if, in accordance with another design of the invention, the supporting surfaces inside the opening are provided with graduations inside two border areas that border each opening on the sides. In the case of such a design the frame does not project out of the opening.

In another advantageous design of the invention, the frame has an extension arm that has supply connections at least for the coolant and that reaches through the process chamber on a longitudinal side. In the case of this design, coolant connections inside the process chamber that have to be detached when disassembling the built-in parts are dropped, as a result of which the danger of the coolant escaping inside the process chamber due to connections that are not tight does not apply.

When using the frame in the process chamber the supply connections can engage automatically with the respective feeding connections if the supply connections are aimed downwards and coolant supply connections are arranged on the outside on the process chamber and are aligned with the supply connections of the extension arm. The coolant feeding connections can have stop valves that automatically close as soon as one raises the frame and the supply must therefore be interrupted. The necessary electrical connections and the process gas connection can also run through this extension arm.

An overheating of the screens can be avoided in an especially easy way and without increasing the effort involved in disassembling and reassembling the screens if the screens with the coolant have cool water pipes connected to the coolant.

In this connection it is especially advantageous when the screens are designed like boxes and have areas running between two transport rollers near the shells of these transport rollers. Such cooled screens may absorb and carry away the radiation heat of the transport rollers positioned in their direct vicinity.

The connection of the screens with the coolant inside the frame can take place in an especially easy way without the danger of the coolant entering into the process chamber when the coolant lines leak if, according to another design of the invention, the frame on the side of the extension arm has a supply room closed toward the process chamber that is connected to the atmosphere and in which the hoses serving the coolant connection to the screen are positioned.

To prevent a secondary flow of the process gases on the outside of the frame instead of in the coating area, the frame is sealed by compressive sealings near the screens on its underside on the intermediate bottom of the process chamber.

The feeding of the process gas can also take place without connections inside the process chamber if, according to another design of the invention, the top has gas pipes for feeding the process gas and gas connections that reach through the process chamber and if the process chamber has gas feeding connections that are aligned on the outside with the gas connections.

It is also advantageous when the frame is mechanically connected to the top of the cathode arrangement. In such a working form the frame is pulled from the process chamber at the same time the cathode arrangement is raised.

The invention allows for different models. One of them is represented in the drawings and described below.

BRIEF DESCRIPTION OF THE DRAWINGS

FIG. 2 a front view of a cathode unit,

FIG. 3 a front view of a frame of the coating apparatus,

FIG. 4 a side view of the cathode unit,

DETAILED DESCRIPTION OF THE INVENTION

Figure 1:
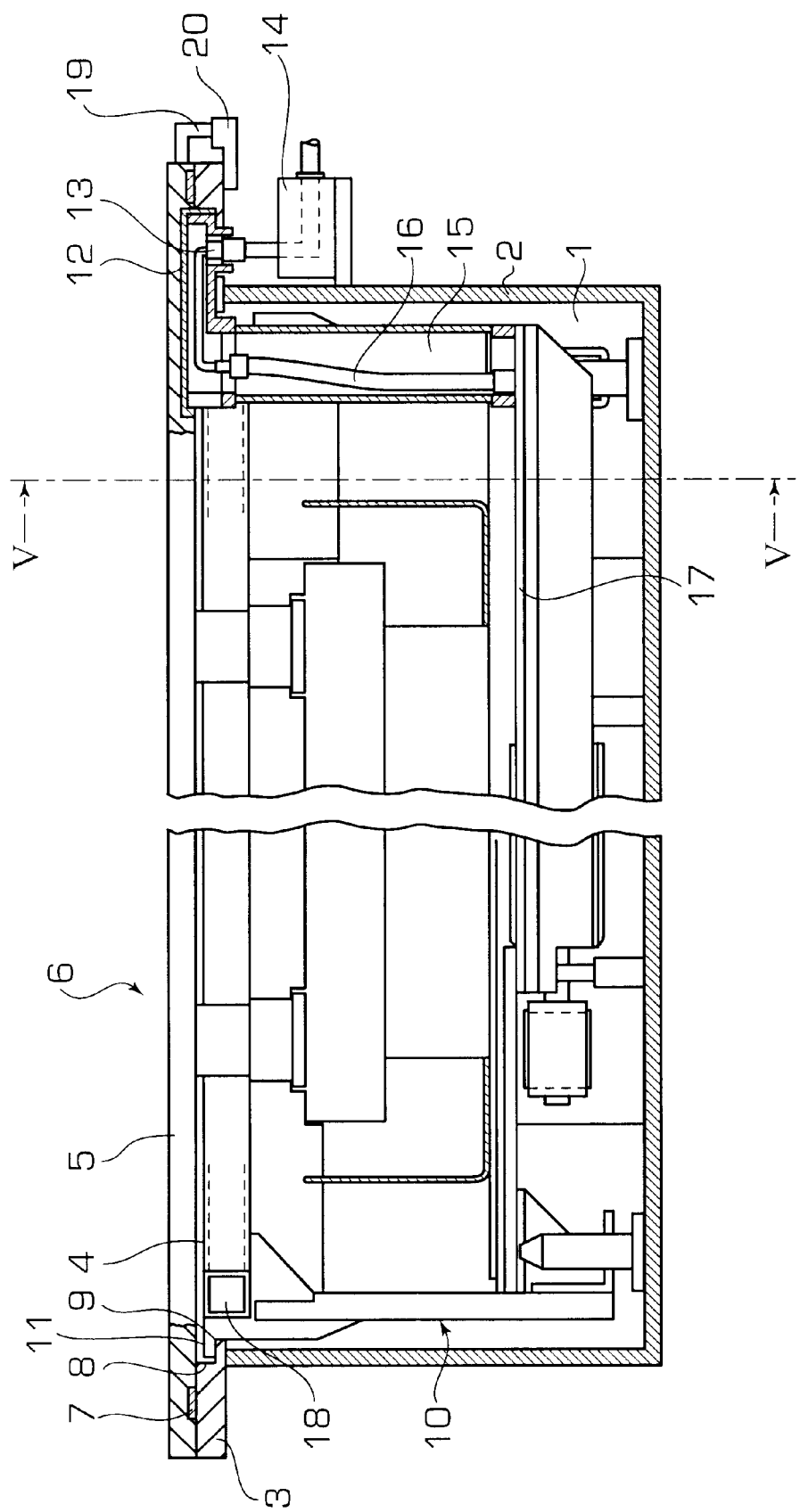
FIG. 1 a cross section through a coating apparatus according to the invention.

FIG. 1 shows a cross section through a process chamber 1 of a coating apparatus. This process chamber 1 has a chamber casing 2, which is covered at the top by a chamber roof 3. This chamber roof 3 has an opening 4, which is closed at the top by a top 5 of a cathode arrangement 6. A gasket 7 seals off this top 5 opposite the chamber roof 3. The chamber roof 3 has graduations 8 at the opening 4 in which supporting surfaces 9 arise.

Inside the process chamber 1 a frame 10 is arranged that is supported by supporting parts 11 on the supporting surfaces 9 of the opening 4 in such a way that the frame 10 does not project over the chamber roof 3. In this way, the top 5 is directly supported on the chamber roof 3.

As FIG. 1 also shows, the frame 10 reaches with an extension arm 12 over its chamber casing 2 on a longitudinal side of the process chamber 11. This extension arm 12 has supply connections 13, which are aligned with the coolant supply connections 14 provided on the outside of the chamber casing 2 and are connected to each other in a built-in state of the frame 10. On the side of the extension arm 12 the frame 10 has a supply room 15 that is sealed toward the process chamber 1 and in which coolant lines 16 run that connect the screens 17 with the coolant via the supply connections.

Under the top 5 there are gas pipes 18 attached to the top. The gas pipes 18 serve to supply the process gas. Supplying this process gas takes place in a way similar to supplying the coolant through a gas connection 19, which projects over the process chamber 1 on the sides and is connected to a gas supply connection 20 there.

FIG. 2 shows the cathode arrangement 6 as a single piece. It has a target 21 under the top 5.

In FIG. 3 the frame is represented as a single piece. One sees again the extension arm 12 through which the supply of the coolant takes place.

In FIG. 4 one can see that in the working example shown the cathode arrangement 6 has a total of two cathodes 22, 23.

Figure 5:
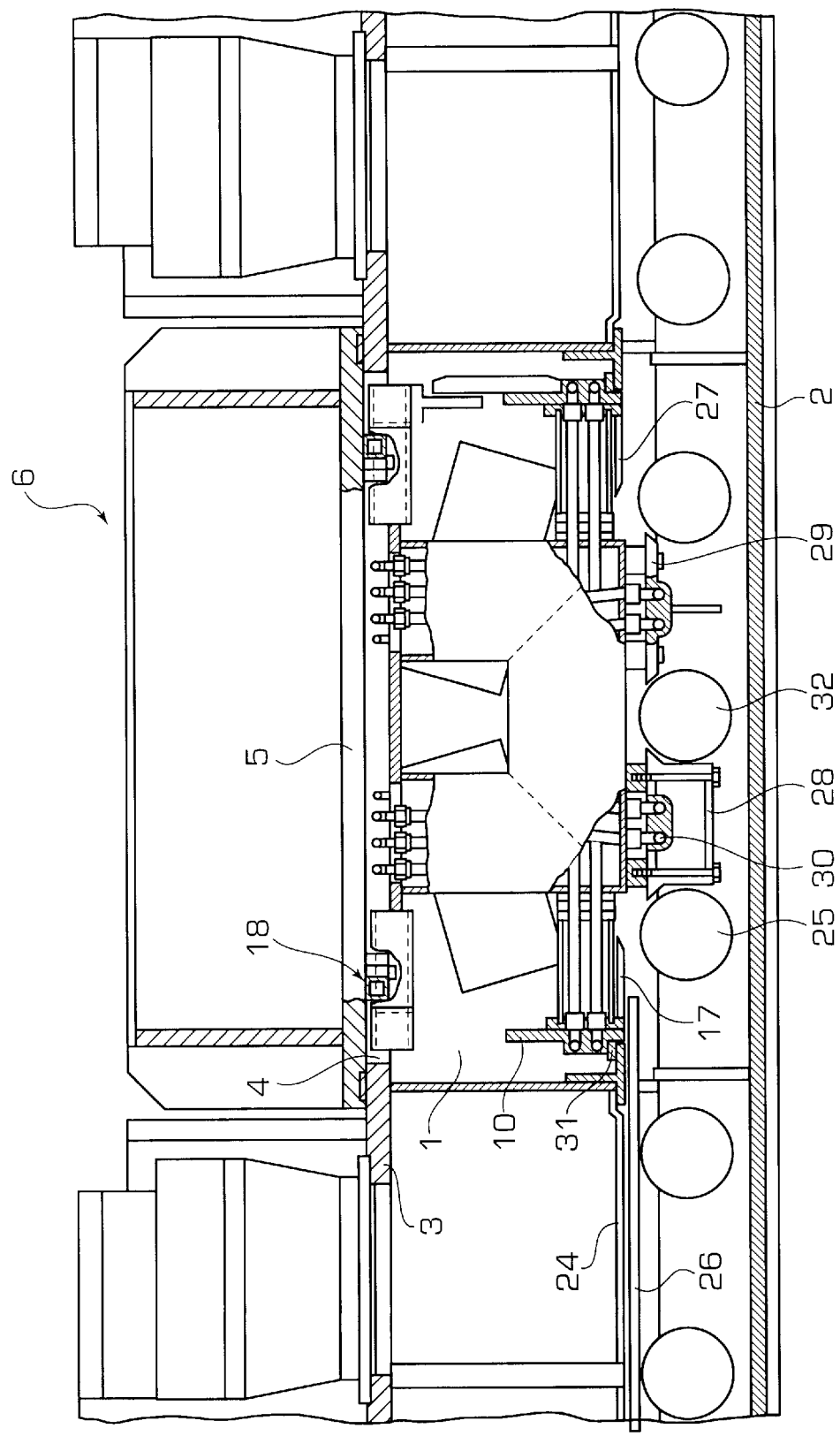
FIG. 5 a longitudinal view through a subarea of the coating apparatus, seen in the direction of movement of the substrate to be coated.

In FIG. 5 one can see that the process chamber 1 has transport rollers 25, 32 under an intermediate bottom 24, as a result of which the substrates to be coated are run through the single process chamber 1. Noteworthy is that besides the screen 17 already positioned in FIG. 1, other screens 27, 28, 29 are provided, each of which has cool water lines that allow for effective cooling by using the cooling agent. The screen 28 is shaped like a box and has areas running between the two bordering transport rollers 25, 32 near the shells of these transport rollers 25, 32. In this way the screen 28 is particularly capable of absorbing the radiated heat of these transport rollers 25, 32.

Compressive sealings 31 seal the frame 10 on its underside from the intermediate bottom 24 so that bypass flows of the process gases emitted from the gas pipes 18 are avoided.

Not represented in the drawings is a model in which the frame 10 is mechanically connected to the top 5 of the cathode arrangement 6. In such a model one can pass all the supply lines from the frame 10 through the top 5. This has the advantage that when the cathode arrangement 6 is raised up, the frame is also lifted with the process chamber 1.

Guide to Reference Numbers 1 process chamber
2 chamber casing
3 chamber roof
4 opening
5 top
6 cathode arrangement
7 gasket
8 graduation
9 self-engaging surface
10 frame
11 support part
12 extension arm
13 supply connection
14 coolant supply connection
15 supply room
16 coolant line
17 screen
18 gas line
19 gas connection
20 gas supply connection
21 target
22 cathode
23 cathode
24 intermediate bottom
25 transport rollers
26 substrate
27 screen
28 screen
29 screen
30 cool water lines
31 compressive sealings
32 transport rollers

What is claimed is:

1. A device for coating plate-shaped substrates by cathodic sputtering comprising:

a plurality of process chambers provided one after the other wherein each process chamber is bordered by a chamber roof and has an opening that is covered by a top;

at least one cathode to be sputtered provided in said opening;

a frame that projects into said process chamber and slides out upward from said opening and that is supported with support parts on supporting surfaces of said chamber roof; and a plurality of screens and supply lines provided on said frame, wherein said top is provided over said support parts on said chamber roof to form a sealing means.

2. The device according to claim 1, wherein the supporting surfaces inside the opening are provided with graduations inside two border areas that border each opening on the sides.

3. The device according to claim 1, wherein the frame has on its longitudinal side an extension arm that reaches through the process chamber with supply connections at least for coolant.

4. The device according to claim 3, wherein the supply connections have coolant supply connections positioned on an underside and outside of the process chamber that are aligned with the supply connections of the extension arm.

5. The device according to claim 1, wherein the screens have cool water lines connected to the coolant.

6. The device according to claim 5, wherein the screens are shaped like boxes and have areas running between two transport rollers.

7. The device according to claim 1, wherein the frame near the screens is sealed by compressive sealings on its underside opposite an intermediate bottom of the process chamber.

8. The device according to claim 1, wherein the top has gas lines to supply process gases and gas connections reaching through the process chamber wherein the process chamber has gas supply connections aligned on the outside with the gas connections.

9. The device according to claim 1, wherein the frame is mechanically connected to the top.

10. The device according to claim 1, wherein the supply lines are coolant lines.

11. The device according to claim 10, wherein the frame has, on a side of an extension arm, a supply room that is closed towards the process chamber and connected to the atmosphere and in which the coolant lines serving a coolant connection to the screens are positioned.

* * * * *